US011391770B1

(12) United States Patent
Tsironis

(10) Patent No.: US 11,391,770 B1
(45) Date of Patent: Jul. 19, 2022

(54) HETERODYNE ACTIVE ELECTRONIC LOAD PULL TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 251 days.

(21) Appl. No.: 16/418,567

(22) Filed: May 21, 2019

(51) Int. Cl.
*G01R 31/28* (2006.01)
*G01R 31/26* (2020.01)

(52) U.S. Cl.
CPC ..... *G01R 31/2822* (2013.01); *G01R 31/2607* (2013.01)

(58) Field of Classification Search
None
See application file for complete search history.

(56) References Cited

U.S. PATENT DOCUMENTS

| | | | |
|---|---|---|---|
| 5,276,411 A | 1/1994 | Woodin, Jr. et al. | |
| 6,639,393 B2 | 10/2003 | Tasker et al. | |
| 7,282,926 B1 | 10/2007 | Verspecht et al. | |
| 9,921,253 B1 | 3/2018 | Tsironis | |
| 10,444,266 B1 * | 10/2019 | Tsironis | G01R 31/2608 |
| 10,725,094 B1 * | 7/2020 | Tsironis | G01R 31/2621 |

OTHER PUBLICATIONS

Load Pull, online, Wikipedia [Retrieved on Aug. 24, 2017]. Retrieved from Internet <URL: http://en.wikipedia.org/wiki/Load_pull>.
"Computer Controlled Microwave Tuner, CCMT", Product Note 41, Focus Microwaves Inc., Jan. 1998, pp. 2-4.
"Measurement of Impedance Tuner", presentation by Yangping Zhao, Polytechnique de Montreal, Mar. 2014.
PIN diode [online], Wikipedia [retrieved on Jun. 10, 2018]. Retrieved from Internet <URL:https://en.wikipedia.org/wiki/PIN_diode>.
"Introduction to Mixers, Lecture 15", Prof. Ali M. Niknejad, University of California, Berkeley, 2015.
Circulator [online], Wikipedia [retrieved on Mar. 7, 2019]. Retrieved from Internet <URL: https://en.wikipedia.org/wiki/Circulator>.
Low-pass filter [online], Wikipedia [retrieved on Mar. 7, 2019]. Retrieved from Internet <URL: https://en.wikipedia.org/wiki/Low-pass_filter>.
Amplifier [online], Wikipedia [retrieved on Mar. 7, 2019]. Retrieved from Internet <URL: https://en.wikipedia.org/wiki/Amplifier>.

(Continued)

*Primary Examiner* — Jermele M Hollington
*Assistant Examiner* — Suresh K Rajaputra

(57) ABSTRACT

A heterodyne, wideband active load pull tuner allows creating and controlling the reflection in a different frequency range than the operation frequency. It comprises an active feedback loop and a digital electronic tuner, wherein the electronic tuner operates at a single frequency while the active loop is wideband. This is achieved using a pair of down- and up-conversion stages, driven by an external signal source (local oscillator) which tracks the operation frequency and creates a fixed intermediate frequency, which is processed by the electronic tuner. This, two-frequency operation bypasses all circulator and electronic tuner bandwidth limitations and uses readily available large band components such as mixers and amplifiers.

16 Claims, 15 Drawing Sheets

(56) References Cited

OTHER PUBLICATIONS

RF Directional Couplers and 3dB Hybrids Overview [online], MACOM Application note M560 [retrieved on Mar. 7, 2019]. Retrieved from Internet <URL: http://qtwork.tudelft.nl/~schouten/linkload/dircouplersm560.pdf>.
Load Pull for Power Devices [online], Microwaves101 [ retrieved on Mar. 7, 2019]. Retrieved from Internet <URL: https://www.microwaves101.com/encyclopedias/load-pull-for-power-devices>.
Heterodyne [online], Wikipedia [retrieved on Mar. 3, 2019]. Retrieved from Internet <URL: https://en.wikipedia.org/wiki/Heterodyne>.
Application Note on Transformers, (AN-20-002) [online], Mini-Circuits [retrieved on Mar. 7, 2019]. Retrieved from Internet <URL: https://www.minicircuits.com/app/AN20-002.pdf>.
Power dividers and directional couplers [online], Wikipedia [retrieved on Mar. 24, 2019], Retrieved from Internet <URL: https://en.wikipedia.org/wiki/Power_dividers_and_directional_couplers>.

* cited by examiner

FIG. 5A
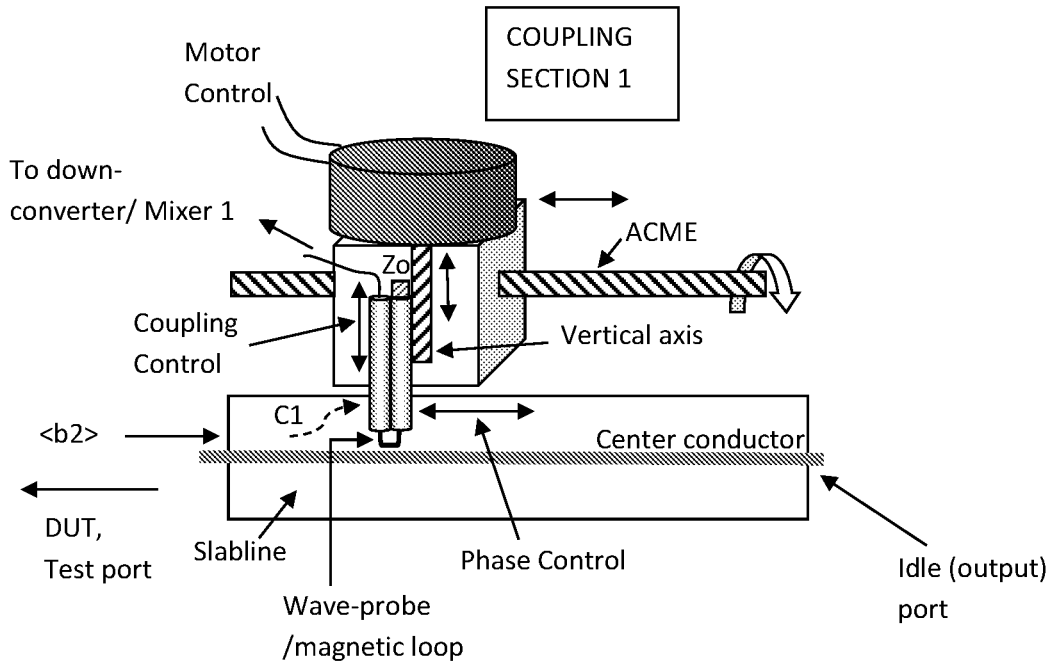
FIG. 5B: Prior art
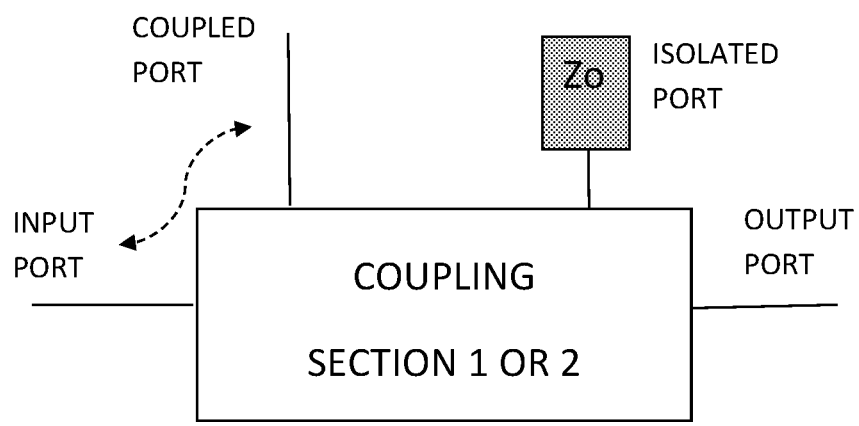

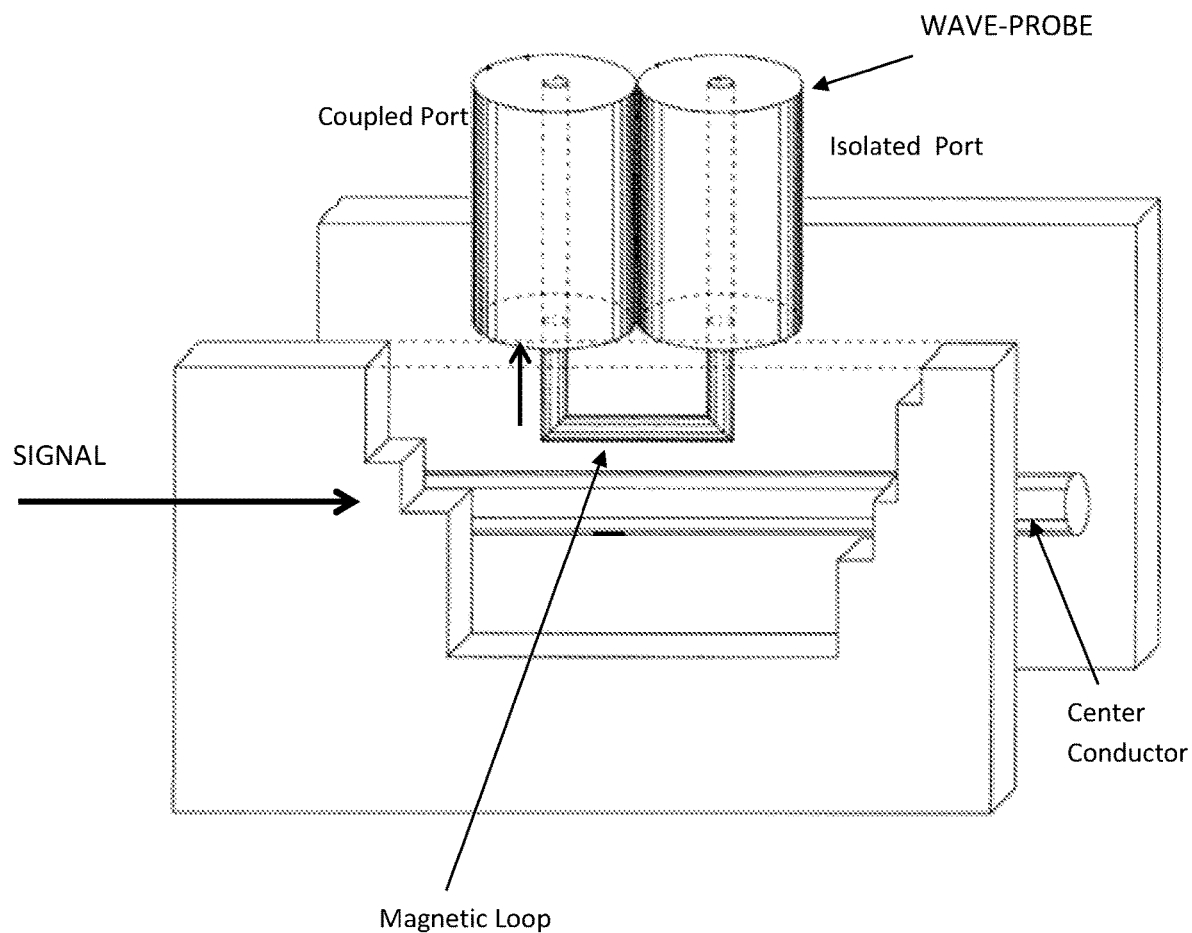
FIG. 7: Prior art

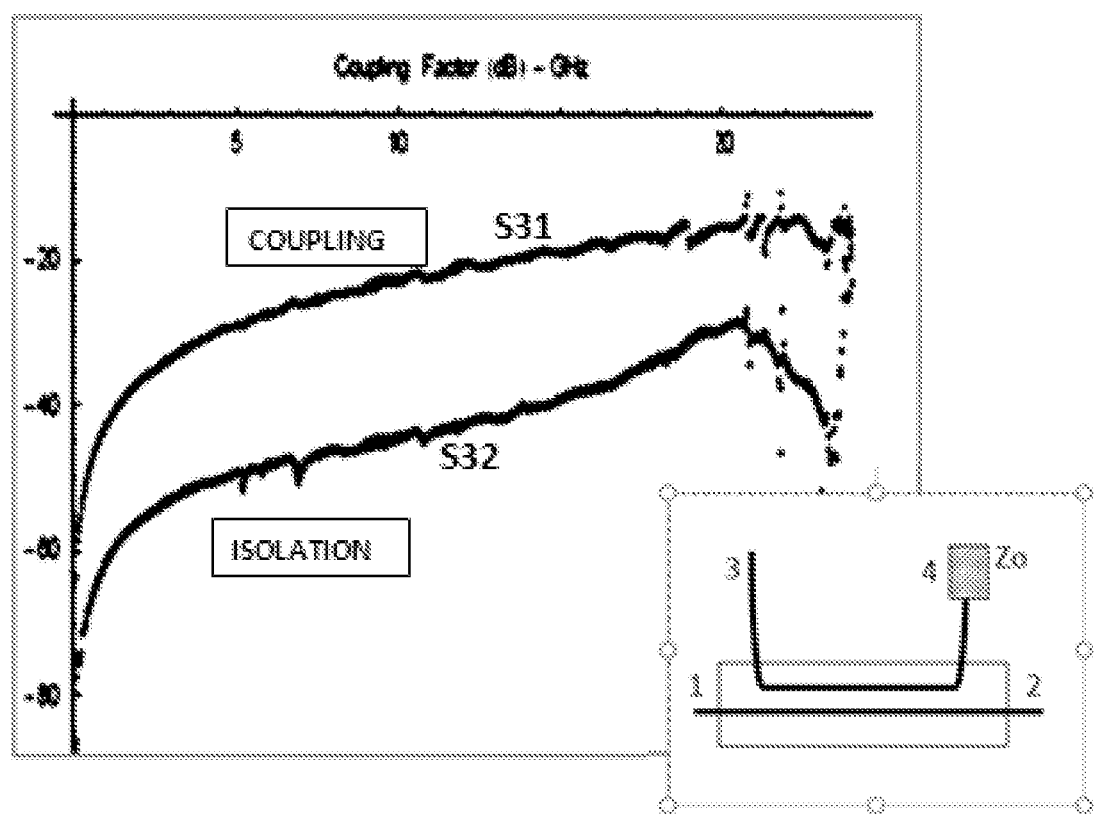
FIG. 8: Prior art

FIG. 9A: Prior art
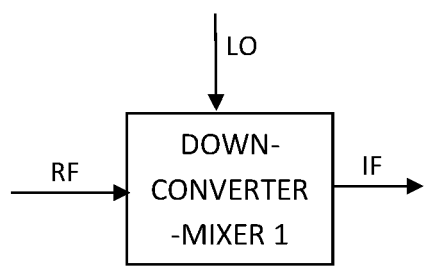
FIG.9B: Prior art
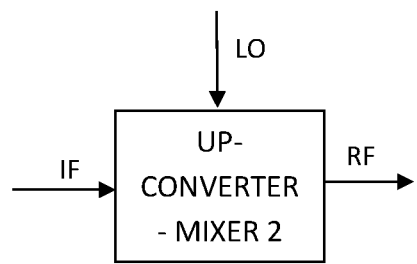

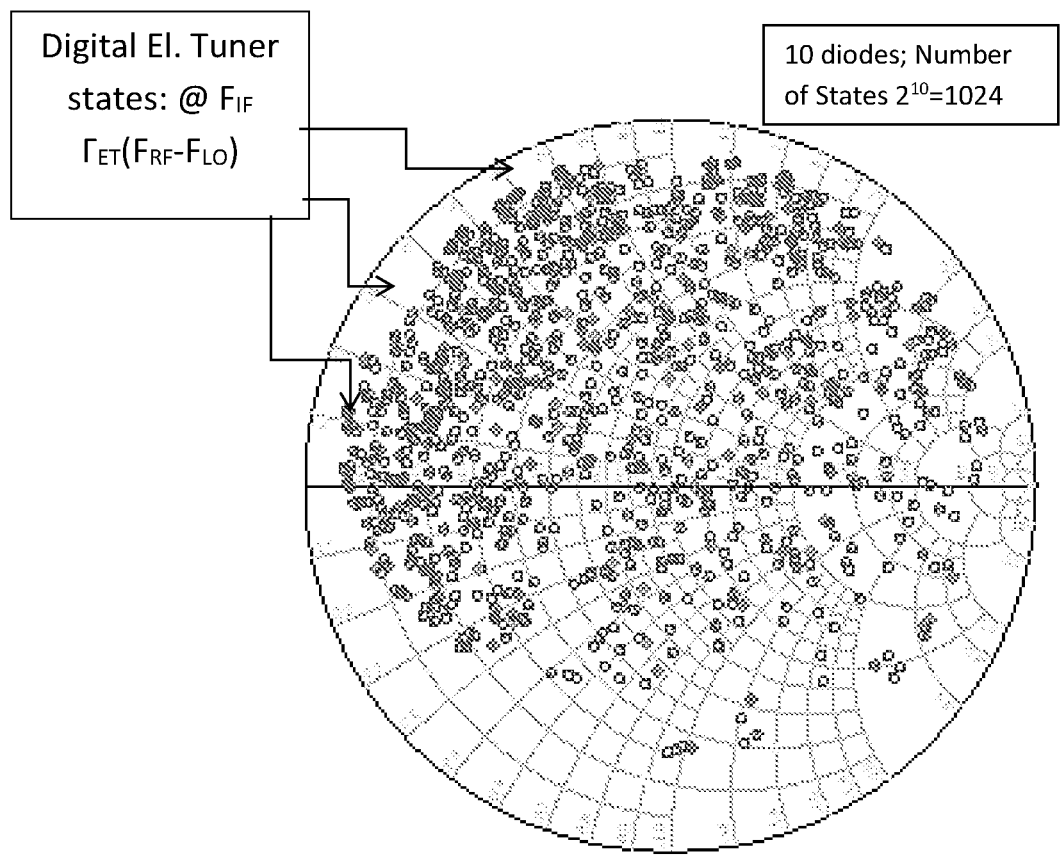
FIG. 10: Prior art

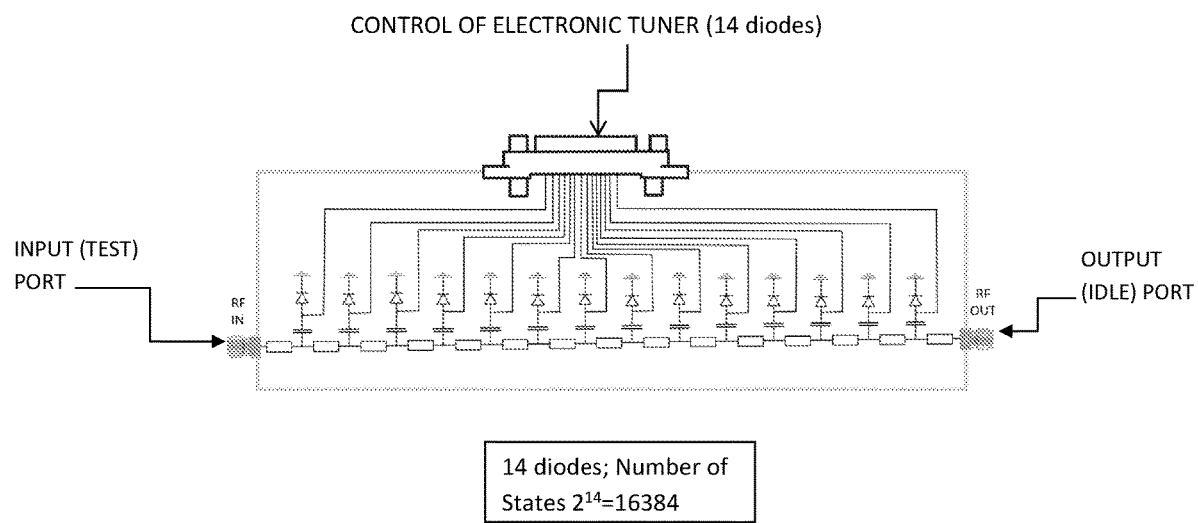
FIG. 11: Prior art

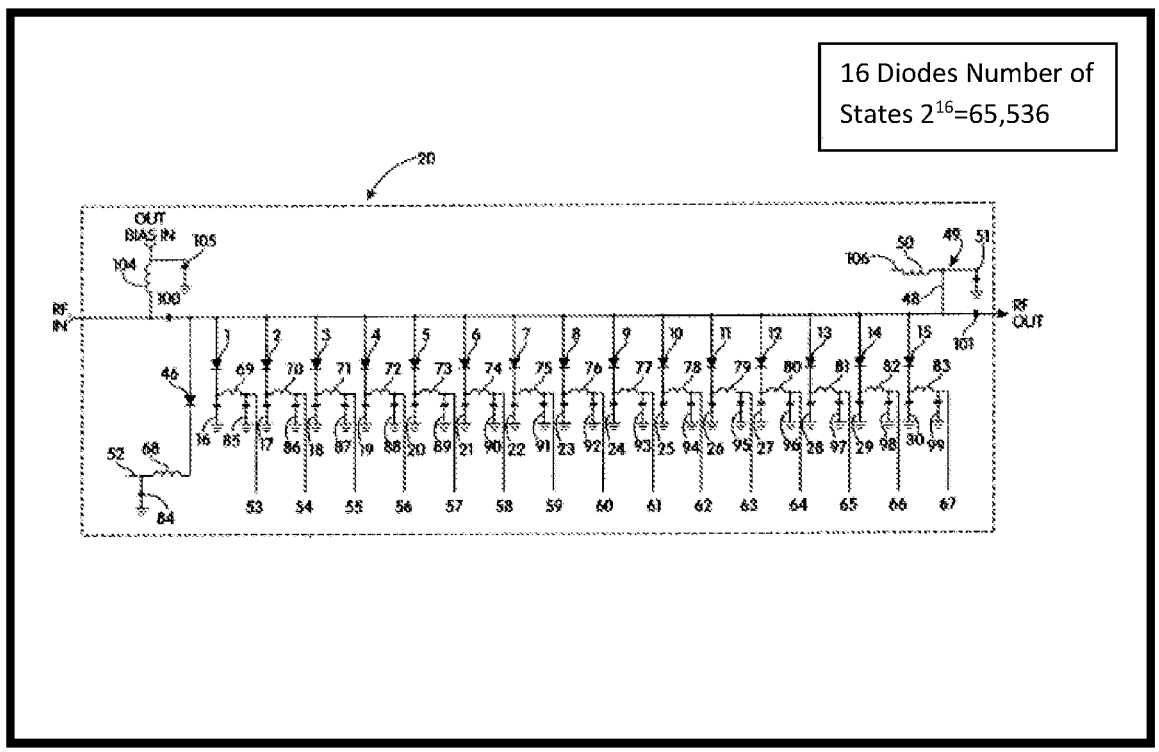
FIG. 12: Prior art

HETERODYNE ACTIVE ELECTRONIC LOAD PULL TUNER

PRIORITY CLAIM

Not applicable.

CROSS-REFERENCE TO RELATED ARTICLES

1. Load Pull, online, Wikipedia [Retrieved on 2017 Aug. 24]. Retrieved from Internet <URL: http://en.wikipedia.org/wiki/Load_pull>.
2. "Computer Controlled Microwave Tuner, CCMT", Product Note 41, Focus Microwaves Inc., January 1998, pages 2-4.
3. Verspecht et al., U.S. Pat. No. 7,282,926, "Method and an apparatus for characterizing a high-frequency device-under-test in a large signal impedance tuning environment".
4. Woodin Jr. et al., U.S. Pat. No. 5,276,411, "High power solid state programmable load".
5. "Measurement of Impedance Tuner", presentation by Yangping Zhao, Polytechnique de Montreal, March 2014.
6. Tasker et. al., U.S. Pat. No. 6,639,393, "Methods and apparatus for time-domain measurement with a high frequency circuit analyzer".
7. PIN diode [online], Wikipedia [retrieved on 2018-06-10]. Retrieved from Internet <URL:https://en.wikipedia.org/wiki/PIN_diode>.
8. "Introduction to Mixers, Lecture 15", Prof. Ali M. Niknejad, University of California, Berkeley, 2015.
9. Circulator [online], Wikipedia [retrieved on 2019-03-07]. Retrieved from Internet <URL: https://en.wikipedia.org/wiki/Circulator>.
10. Low-pass filter [online], Wikipedia [retrieved on 2019-03-07]. Retrieved from Internet <URL: https://en.wikipedia.org/wiki/Low-pass_filter>.
11. Amplifier [online], Wikipedia [retrieved on 2019-03-07]. Retrieved from Internet <URL: https://en.wikipedia.org/wiki/Amplifier>.
12. RF Directional Couplers and 3 dB Hybrids Overview [online], MACOM Application note M560 [retrieved on 2019-03-07]. Retrieved from Internet <URL: http://qtwork.tudelft.n1/~schouten/linkload/dircouplersm560.pdf>.
13. Load Pull for Power Devices [online], Microwaves101[retrieved on 2019-03-07]. Retrieved from Internet <URL: https://www.microwaves101.com/encyclopedias/load-pull-for-power-devices>.
14 Heterodyne [online], Wikipedia [retrieved on 2019-03-03]. Retrieved from Internet <URL: https://en.wikipedia.org/wiki/Heterodyne>.
15. Tsironis, C., U.S. Pat. No. 9,921,253, "Method for reducing power requirements in active load pull system".
16. Application Note on Transformers, (AN-20-002) [online], Mini-Circuits [retrieved on 2019-03-07]. Retrieved from Internet <URL: https://www.minicircuits.com/app/AN20-002.pdf>.
17. Power dividers and directional couplers [online], Wikipedia [retrieved on 2019-03-24]. Retrieved from Internet <URL: https://en.wikipedia.org/wiki/Power_dividers_and_directional_couplers>

BACKGROUND OF THE INVENTION AND PRIOR ART

This invention relates to Non-50Ω load pull testing (see ref. 1) of microwave transistors (DUT). Load pull is a method by which the load impedance presented to the DUT at a given frequency is changed systematically and the DUT performance is measured, with the objective to find optimum matching networks for the overall network design objectives, such as maximum gain, power, efficiency, linearity or else, and determine the necessary load impedances to be presented to the transistor (DUT).

A prior art scalar load/source pull test system is shown in FIG. 1. It comprises a signal source, source (input) and load (output) impedance tuners, a device under test (DUT, transistor) housed in a coaxial or microstrip test fixture or in form of a micro-chip on a semiconductor wafer, accessed using microscopic wafer probes, and input and output measurement instruments. The instruments can measure power, DC bias and various spectral components, generated either by the source and modified by the DUT, or generated inherently by the non-linearities of the DUT itself. The tuners and the instruments are controlled by a PC controller using appropriate digital communication protocols (GPIB, USB, RS 232, LAN etc.). The data acquired by the test software comprise RF and DC response of the DUT to input stimulus for given source and load impedances. The data are saved in load pull files and serve to (a) qualify the DUT regarding some target specifications and (b) design optimum source and load matching networks for given target performance, this being output power, linearity, efficiency etc.

The load pull setup of FIG. 1 is a classical "scalar" setup: the injected (available) input power is measured by an input power meter attached to the directional coupler. The power delivered by the output tuner to the load is measured using the output power meter. No reflected powers or signal phase information can be measured. The tuners are pre-calibrated and the measurement accuracy depends on their mechanical repeatability. Mechanical precision is therefore crucial. The load pull setup of FIG. 2 is different: Herein bi-directional couplers (input and output) are inserted between the tuners and the DUT. The method is called "wave load pull", (see ref. 6) because the couplers allow measuring the forward <a> and reverse <b> travelling waves, <a1> and <b1> at the input and <a2> and <b2> at the output of the DUT; we therefore know the reflected power wave at the input of the DUT <b1> and the power reflected from the load <a2>; this allows calculating the input reflection factor ($\Gamma_{IN}$=<b1>/<a1>) of the DUT as well as the in-situ source reflection factor ($\Gamma_{source}$=<a1>/<b1>) and the load reflection factor ($\Gamma_{Load}$=<a2>/<b2>), without using tuner calibrations and relying on the mechanical repeatability of the passive tuners (see ref. 2). In the case of active systems (see ref. 13) the wave load-pull method is mandatory, since the reflection factor created by active systems depends on the linearity of the feedback amplifiers, (see ref. 11) which can change with the processed power and, therefore, cannot be pre-calibrated.

Active tuning is the method of creating a load impedance not by reflecting signal on a real (passive) load (output) tuner, but by injecting into the DUT a signal coherent with the input signal. By controlling amplitude and phase of the injected signal one can control the complex load impedance and, by using amplification, one can apply more power to the DUT than the DUT injects into the load, thus creating a reflection factor <a2>/<b2> that may exceed 1. This capacity of active systems is used to compensate for insertion loss of the networks embedding the DUT (cables, adapters, test fixtures or wafer probes). In terms of equations $\Gamma_{Load}$=<a2>/<b2>, with <b2> created by the DUT and <a2> created by the injection. <a2> can be smaller, equal or larger than <b2>.

Wave-probes are simple compact and inherently wideband directional couplers (see ref. 3) with coupling factor ranging between −40 to −20 dB and directivity D=|S31 (dB)−S32(dB)| between 10 and 20 dB (see FIGS. 7 and 8).

Digital electronic tuners (see ref. 5) use microstrip transmission lines and several PIN diodes (see ref. 7), mounted and biased along and between the transmission line and ground (see ref. 4 and FIGS. 11 and 12). Circulators and mixers are standard components, commercially available in a large variety of configurations and bandwidths (see ref. 8 and 9). The same is valid for low and high pass filters (see ref. 10).

Digital electronic tuners and circulators have limitations. The tuners have irregular point distribution over the Smith chart (FIG. 10) limited tuning range and relatively high loss, due to the dielectrically loaded microstrip transmission lines used (FIG. 11). Multi-octave electronic tuners, although feasible, require in-depth knowledge of the design and manufacturing technology and are not commercially available. Circulators, on the other hand, are commercially available but critically band-limited (see ref. 9). Octave-band circulators exist only above 1 GHz and higher than octave band circulators are rare. Frequency mixers (see ref. 8) are commercially available in narrow and large band form. They have typically one high frequency (RF) signal port, one pump (local oscillator, LO) port and a low to inter-medium (IF) frequency port. In frequency terms $F_{IF}=F_{RF}-F_{LO}$. The nonlinear characteristic of the diodes used in the mixers create also higher frequency sideband products and must be therefore suppressed using low pass or high pass filters (see ref. 10). The basic mixer response comes from the product of two sinus signals generated by the nonlinearity of the diodes in the mixer: $\sin \omega_1 t \cdot \sin \omega_2 t = \frac{1}{2} \cdot \{\cos(\omega_1-\omega_2)t - \cos(\omega_1+\omega_2)t\}$, wherein $\omega=2\omega \cdot F$; for $\omega 1 = 2\pi F_{RF}$ and $\omega 2 = 2\pi F_{LO}$ means there is an intermediate frequency (IF) component $2\pi \cdot (F_{RF}-F_{LO})$ that has to be processed by the electronic tuner and a high frequency component $2\pi \cdot (F_{LO}-F_{RF})$ that has to be suppressed using the low pass filter. Similar in the up-conversion place, where the low frequency (IF) component $2\pi \cdot (F_{RF}-F_{LO})$ coming out of the mixer 2 (FIG. 4) must be suppressed using the high pass filter (HPF).

BRIEF SUMMARY OF THE INVENTION

The proposed heterodyne (see ref. 14) load pull tuner solution (FIG. 3) bypasses all such limitations and allows for real wideband active load pull tuner: Both octave-band or less circulator (see ref. 9) and electronic tuner technology limitations are bypassed with a single stroke using the heterodyne concept: the operation frequency is mixed down into the circulator/electronic tuner frequency range, to create the load pull impedances, and up again to inject back into the DUT; both the circulator and the associated electronic tuner are not required to cover the whole tuner bandwidth; instead, using down- and up-conversion into a concrete narrow frequency band both said items are allowed to operate and perform best (highest tuning range of the electronic tuner, lowest insertion loss and highest isolation for the circulator). The wideband active load pull tuner comprises an active feedback loop, down- and up-conversion stages and a digital electronic tuner, wherein the electronic tuner operates at a single frequency while the overall active loop is wideband. This is achieved using the down-and-up-conversion stages, driven by an external signal source (local oscillator) which tracks the operation frequency and creates a fixed intermediate frequency, which is processed by the electronic tuner. This, two-frequency operation bypasses all circulator and electronic tuner bandwidth limitations and uses readily available large band components such as mixers and amplifiers. The heterodyne active load pull tuner can be implemented in two basic embodiments (FIGS. 9A and 9B). In a first embodiment the operation frequency is the (high) RF frequency, which is down-converted into the IF frequency, processed by the electronic tuner and up-converted back into the RF frequency, amplified and injected back into the DUT. In a second embodiment the operation frequency is the (low) IF frequency, which is up-converted into the RF frequency (which is now the frequency at which the electronic tuner works—previously the IF frequency), processed by the electronic tuner and down-converted into the low IF frequency, amplified and injected back into the DUT. Example of embodiment 1: $F_{RF}=10$ GHz, $F_{IF}=1$ GHz, $F_{LO}=9$ GHz; example of embodiment 2: $F_{IF}=10$ MHz; $F_{RF}=1$ GHz; $F_{LO}=990$ MHz.

DETAILED DESCRIPTION OF THE DRAWINGS

The invention and its mode of operation will be better understood from the following detailed description when read with the appended drawings in which.

FIG. 5A through 5B depict coupling sections: FIG. 5A depicts adjustable coupling section 1; FIG. 5B depicts prior art: port definitions of coupling sections 1 and 2.

Figure 6:
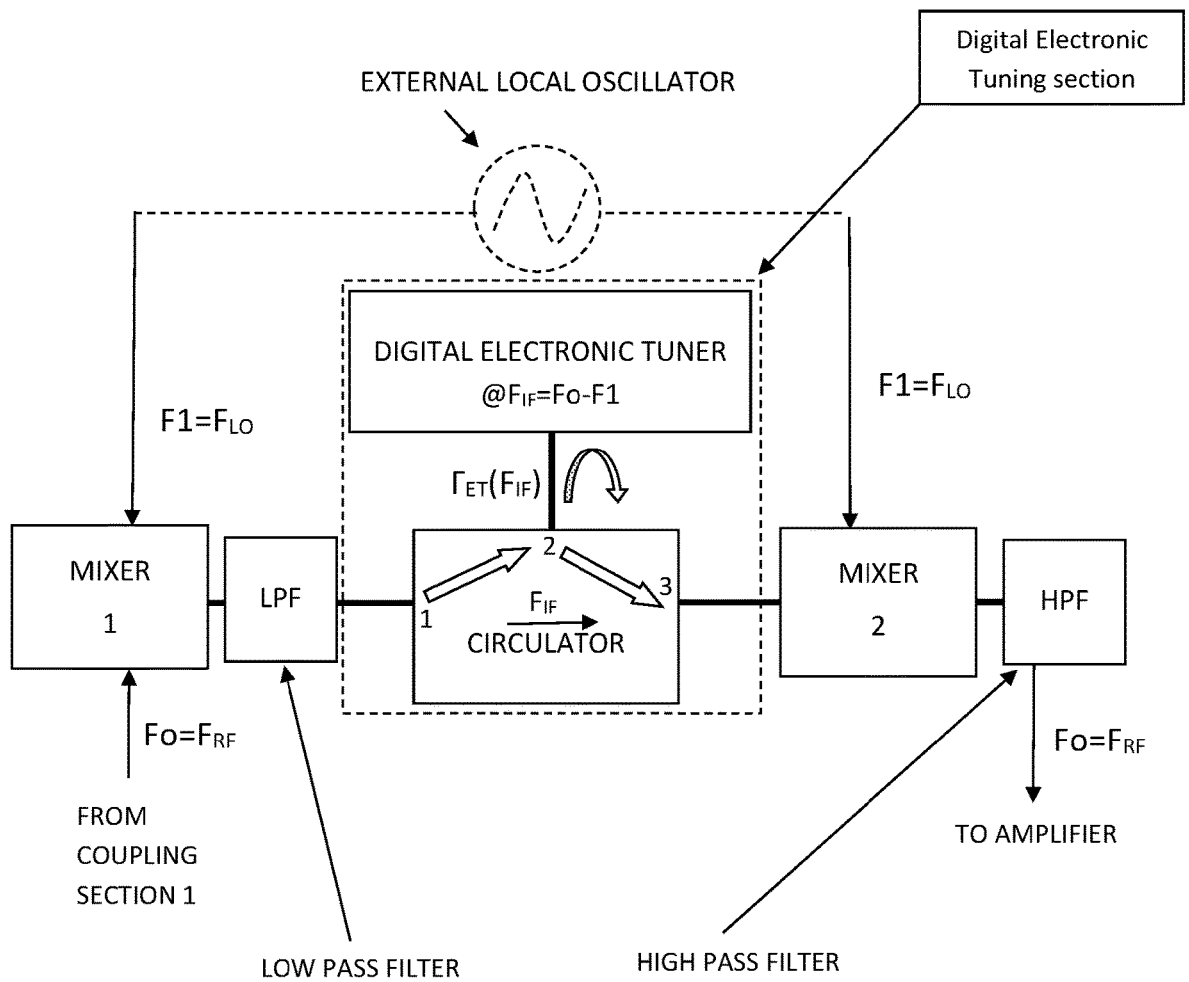

FIG. 6 depicts the core of the heterodyne electronic tuner including up- and down-converters.

FIG. 7 depicts concept and physical layout of the wave-probe.

FIG. 8 depicts prior art, measured coupling, isolation and port definition of the wave-probe coupler.

FIG. 9A through 9B depict prior art, the port definition of up- and down-converters (frequency mixers); FIG. 9A depicts down-converter, FIG. 9B depicts up-converter: $F_{RF}=F_{LO}+F_{IF}$.

FIG. 10 depicts prior art, the complete tuning pattern of an electronic tuner at its internal test port reference plane, using 10 RF switches (PIN diodes).

FIG. 11 depicts a digital electronic tuner prototype using 14 diodes.

FIG. 12 depicts prior art, the electrical scheme of digital diode tuner (see ref. 4).

Figure 13:
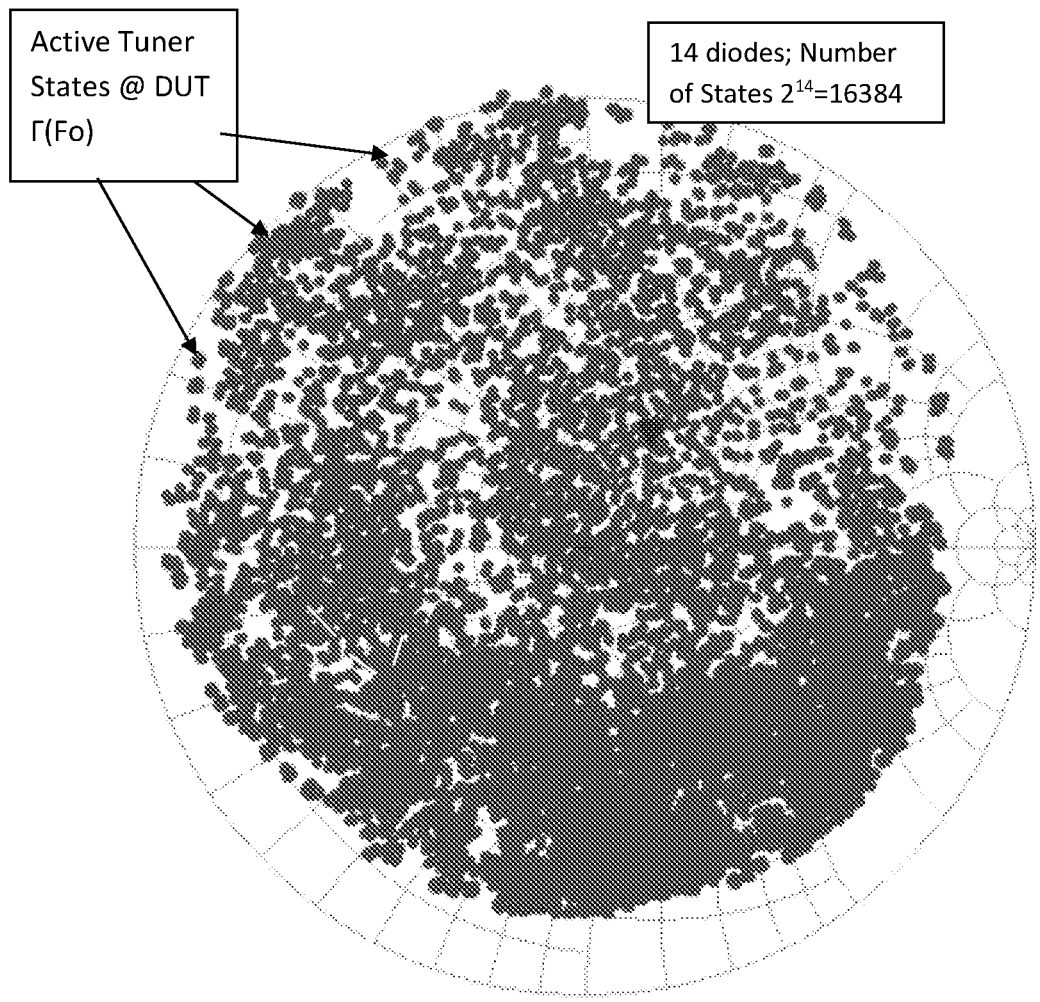
Figure 14:
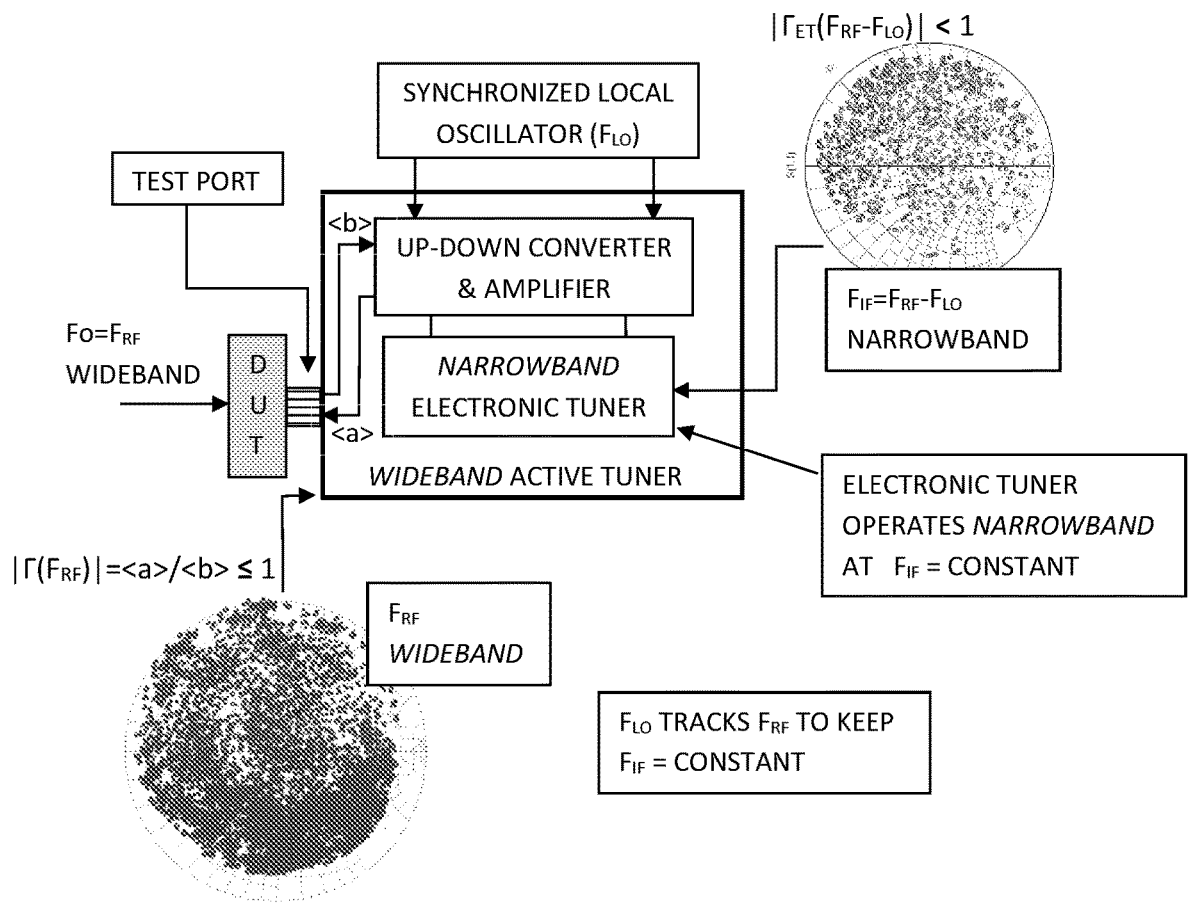

FIG. 13 depicts tuning pattern of active tuner at DUT reference plane (Test Port, as shown in FIG. 14), created by the digital electronic tuner using 14 diodes (from FIG. 11).

FIG. 14 depicts the concept of the active tuner and associated tuning patterns.

Figure 15:
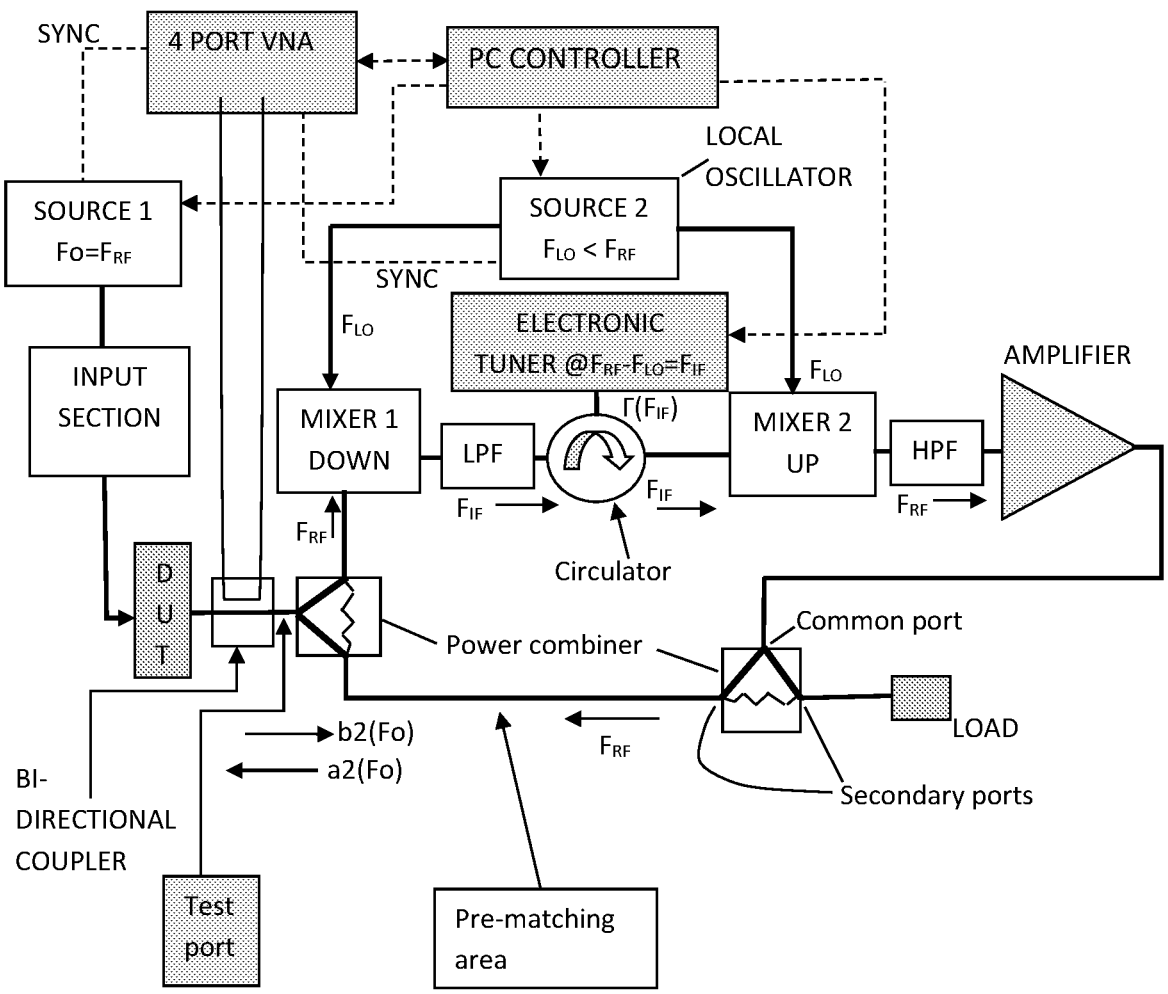

FIG. 15 depicts heterodyne tuner using power combiner/divider in place of either first and/or second coupling section.

DETAILED DESCRIPTION OF THE INVENTION

Figure 1:
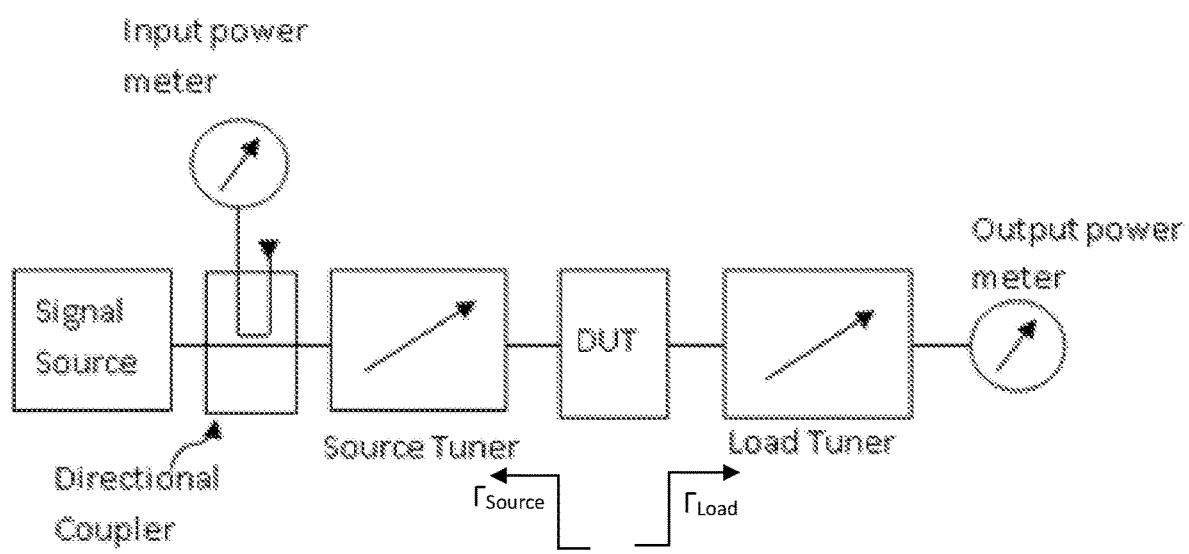
FIG. 1 depicts prior art, a typical load pull test system using passive tuners.
Figure 2:
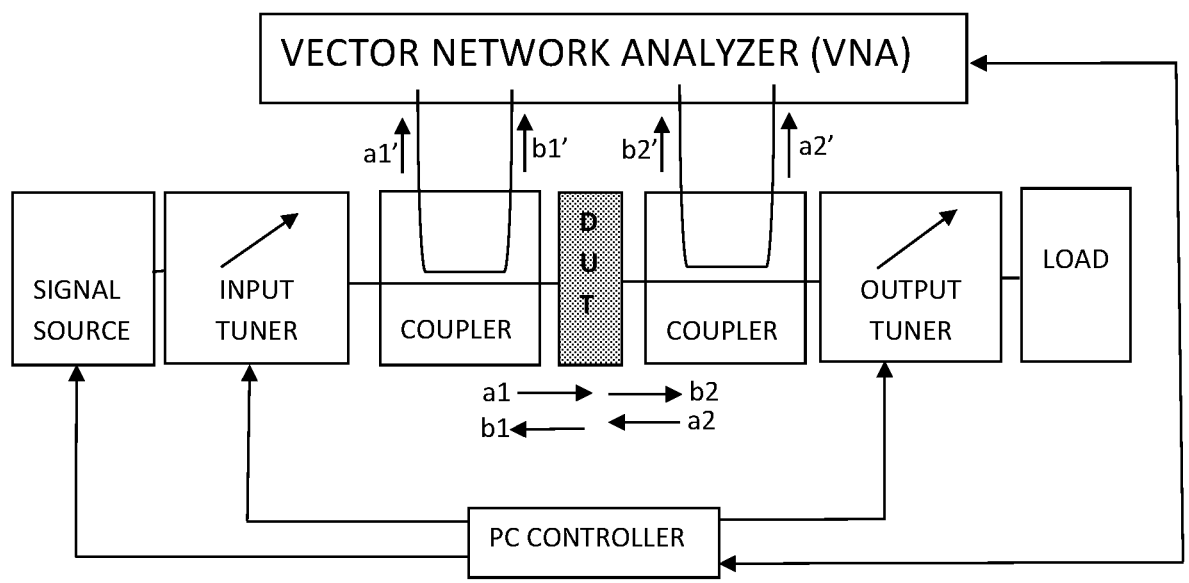
FIG. 2 depicts prior art, a wave-load pull test system.
Figure 3:
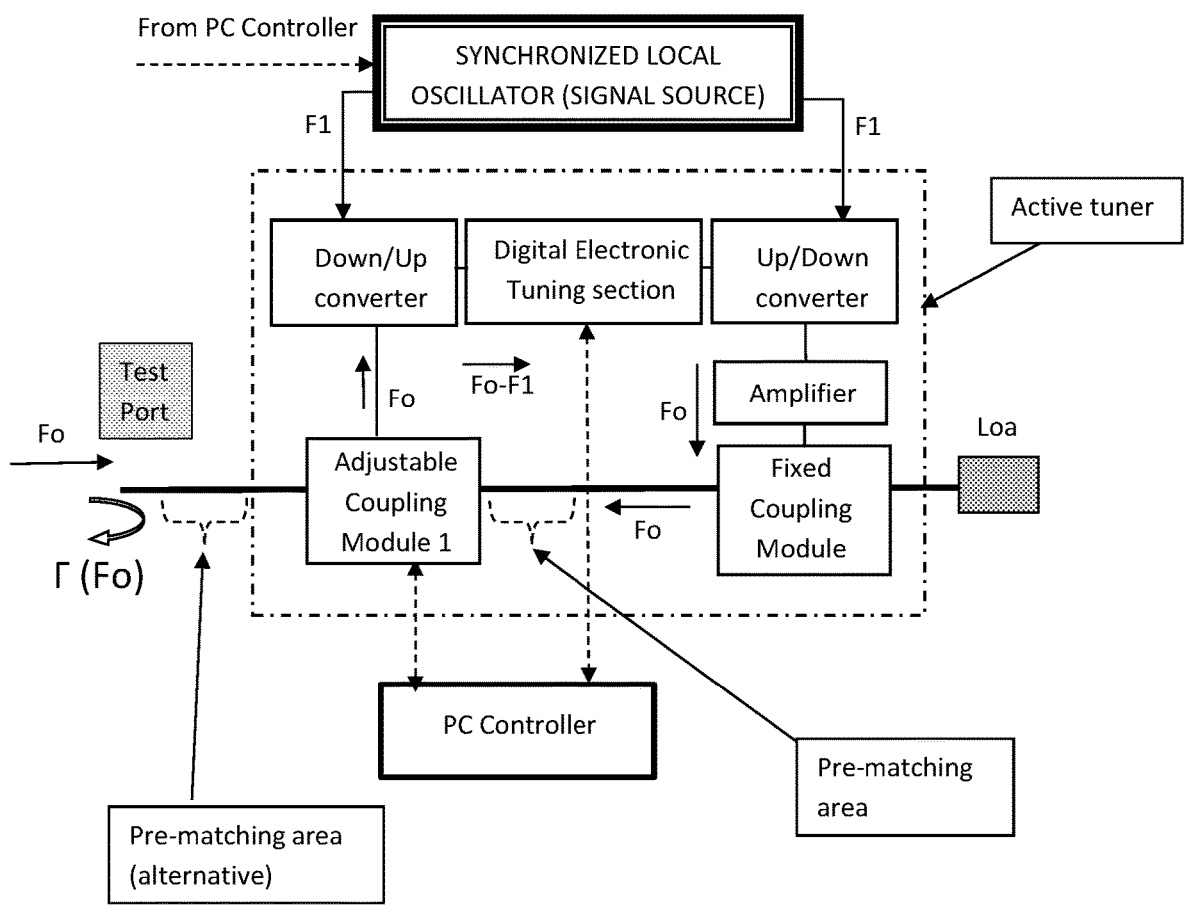
FIG. 3 depicts the concept of heterodyne wideband high-speed active load pull tuner.

The principle of the heterodyne active tuner is shown in FIG. 3. It includes: two coupling sections, one adjustable and one fixed, an up-converter section with low-pass filter, a down-converter section with high-pass filter, a circulator, a digital electronic tuner and an amplifier. Throughout this application the high RF frequency Fo=$F_{RF}$ is injected into the DUT and the load is created at this frequency. The local oscillator frequency F1=$F_{LO}$ is injected into the up- and down-converter frequency mixers and tracks $F_{RF}$ by the intermediate frequency $F_{IF}$=Fo–F1=$F_{RF}$–$F_{LO}$. The converters and the amplifier (see ref. 11) are wideband, available commercially. The electronic tuner is not available commercially, it must be self-made and is associated with a circulator to convert a controlled reflection into a controlled transmission, since the transfer function of the active feedback injection loop must be amplitude and phase controlled, which passive tuners do not do (note: the digital electronic tuner is passive). Tuners, both mechanical slide screw (see ref. 2) and electronic (see ref. 4) control, for load pull purposes, the reflection factor at their test port, not the transmission between test (input) and idle (output) ports.

In the specific case of FIG. 3 signal at the RF frequency Fo=$F_{RF}$ is injected into the transmission line (slabline) of the adjustable coupling module 1 (FIG. 5A) and a portion of the signal is coupled into the coupling port of the wave-probe, whereas the isolated port of the wave-probe is terminated with characteristic impedance Zo. This signal portion is then injected into the down-converter (frequency mixer 1) in FIG. 6. Vertical movement of the axis to which the wave-probe is attached, using a first motor, controls the penetration of the magnetic loop of the wave-probe (FIG. 5A) into the slabline and the proximity to the center conductor and by doing so it controls the amplitude of the coupling factor |C1|. Horizontal movement of the carriage holding the wave-probe, is remotely controlled by a second motor (not shown) via the ACME rod and adjusts the phase of the coupling factor <C1; or the coupling factor is complex: C1=|C1|*exp(j<C1), adjustable in amplitude and phase using the coupling section 1.

The coupled signal <b2> *C1 at frequency Fo=$F_{RF}$ is injected into the mixer 1 (FIG. 5A). The down-converted signal at F=$F_{IF}$=$F_{RF}$–$F_{LO}$ traverses with low insertion loss the low pass filter (LPF) in FIG. 6, which suppresses the higher mixed component at F=$F_{RF}$+$F_{LO}$. The intermediate frequency $F_{IF}$ enters port 1 of the circulator, is transferred to port 2 with minimal insertion loss $S_{21}(F_{IF})$, where it is reflected by the remotely controlled reflection factor $\Gamma_{ET}$ ($F_{IF}$) of the digital electronic tuner. The returned signal is then transferred to port 3 of the circulator and is injected into the IF port of frequency mixer 2 of the up-converter. The desired mixed product is $F_{RF}$=$F_{LO}$+$F_{IF}$ and passes with low insertion loss through the high pass filter; lower frequency components $F_{LO}$–$F_{IF}$ also exist, which are suppressed by the high pass filter (HPF). The high frequency component $F_{RF}$=Fo is amplified by the gain G of the amplifier and coupled back into the slabline of the adjustable coupling section 1 (see FIG. 5B) through the fixed coupling section 2, reduced by the coupling factor C2. Both |C1| and |C2| are smaller than 1. |C1| is typically –15 to –30 dB whereas |C2| shall be as high as possible, such as –3 to –6 dB (see ref. 12). The reason for the proposed values of C1 and C2 is that we do not want to saturate the electronic tuner with excessive injected power from coupler 1 while at the same time we do not want to waste valuable output power from the amplifier into the coupling port of the coupling section 2. Couplers can be fixed or adjustable. In the first embodiment of this invention coupler 1 is used in adjustable form (FIG. 5A). Since adjustable low frequency couplers are not known, in the second embodiment the couplers are fixed. In a third embodiment (FIG. 15) both couplers are replaced by wideband power combiners/dividers (see ref. 17).

Depending on the design and the output port protection of the amplifier, the coupling section 2 can be replaced by a direct connection of the amplifier to the slabline idle port. This will allow reducing the required gain G and output power of the amplifier by a factor C2 (3 to 6 dB).

Considering the above relations an approximate calculation of the re-injected power wave <a2> into the DUT gives (FIG. 4): <a2>≈<b2>*C1($F_{RF}$)*$L_{C1}$*$L_{LPF}(F_{IF})$*$S_{21}^2(F_{IF})$ *$\Gamma_{ET}(F_{IF})$*$L_{C2}$*$L_{HPF}(F_{RF})$*G($F_{RF}$)*C2($F_{RF}$), leading to a load reflection factor $\Gamma_{LOAD}$=<a2>/<b2>≈C1($F_{RF}$) *$L_{C1}$*$L_{LPF}(F_{IF})$*$S_{21}^2(F_{IF})$*$\Gamma_{ET}(F_{IF})$*$L_{C2}$*$L_{HPF}(F_{RF})$*G ($F_{RF}$)*C2($F_{RF}$) shown in FIG. 13. Herein $L_{LPF}$ and $L_{HPF}$ are the insertion loss of the corresponding low pass and high pass filters and $L_{C1}$ and $L_{C2}$ are the conversion loss of the corresponding up- and down-converters (frequency mixers), and $S_{21}$≈$S_{32}$ are the insertion losses between ports 1 and 2 and 2 and 3 of the circulator. As a typical example, assuming C1≈–15 dB (0.032), $L_{C1}$ and $L_{C2}$≈–10 dB (0.1), S21≈–0.2 dB (0.98), C2≈–3 dB (0.5) and $\Gamma_{ET}$≈0.5, gives $\Gamma_{LOAD}$≈0.77*$10^{-5}$*G, which means a gain of approximately 41 dB will allow reaching |$\Gamma_{LOAD}$|≈1. Such amplifiers are readily commercially available. Above calculations are conservative. The adjustable coupling section 1 allows all the signal vectors to be aligned, thus minimizing signal loss due to multiple reflections.

Figure 4:
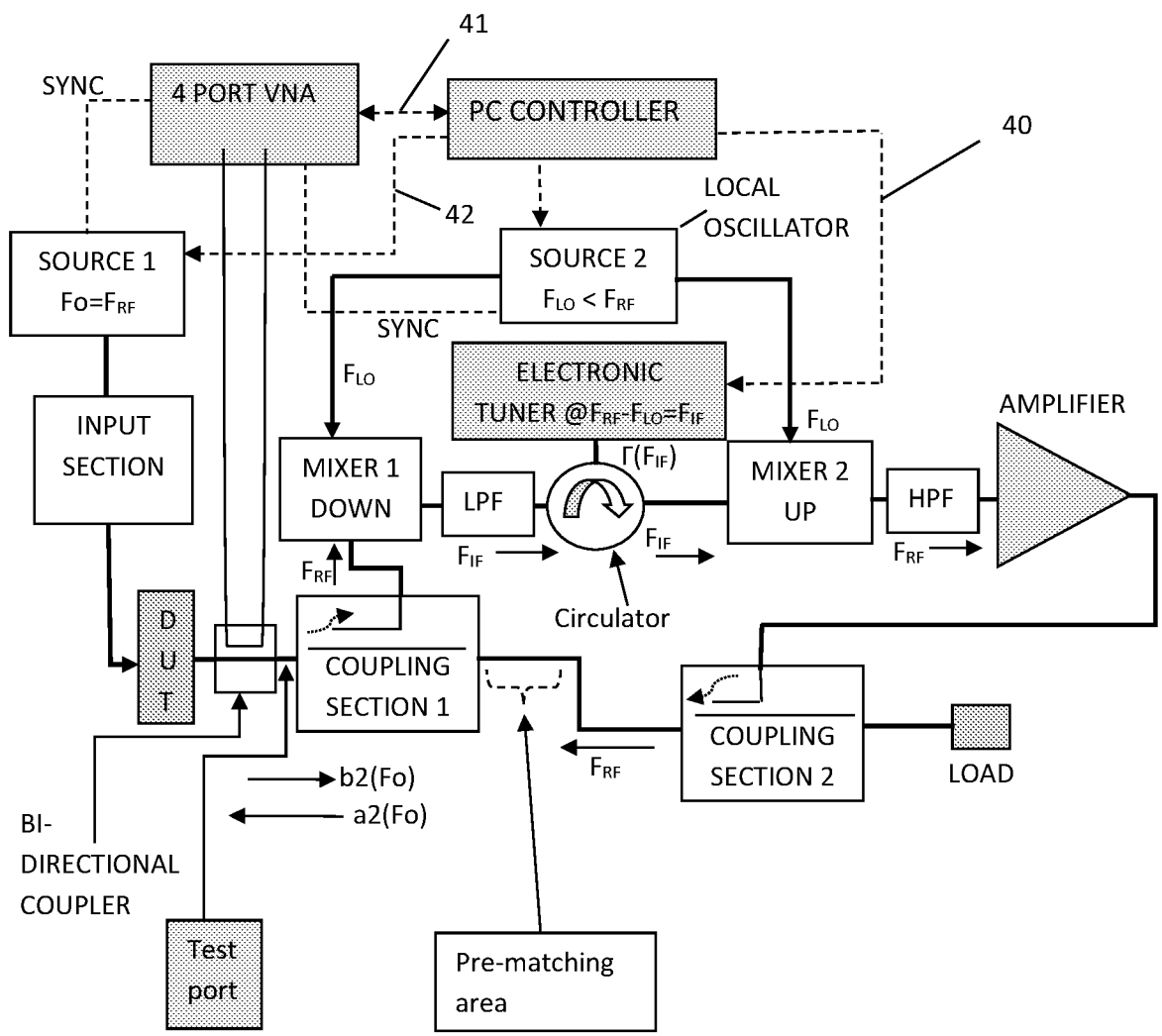
FIG. 4 depicts the detail structure of load pull system with the wideband active tuner.

The entire concept of the heterodyne tuner is shown schematically in FIG. 14 and in detail in FIG. 4 and (including the VNA measurement path through the bidirectional coupler) in FIG. 15. In a further embodiment the second coupling section can be replaced by a circulator. In this case the output of the amplifier is connected to port 1 of the circulator, port 2 of the circulator is connected to the output port of the first coupling section (in our case the output port of the first coupling section is the idle port of the slabline—FIG. 5B) and port 3 of the circulator is terminated with the characteristic impedance (Zo) of the slabline. This configuration has the benefit of lower transfer loss in the feedback loop between the amplifier and the test port (S21 of a circulator is typically 0.2 dB, instead of the coupling factor C2 of 3 to 6 dB in the first two embodiments). The downside of this third embodiment is the frequency coverage limitation due to the limited bandwidth of the circulator, especially for lower frequencies (bandwidths of available circulators below 1 GHz are only a few hundred MHz, whereas, starting at 1 GHz they cover one or slightly more than one octave). The benefit is reducing the requirement in amplifier power. If bandwidth at low frequencies is required, then an embodiment as in FIG. 15 will be most appropriate for using wideband power combiners instead of couplers and circulators; the price to pay is higher coupling loss, compared with circulators. In conclusion, the heterodyne active tuner configuration is best suited for wideband (multi-octave) instantaneous frequency coverage load pull testing of low and medium power transistors, including, especially, medium and low frequencies below 1 GHz, where wideband circulators do not exist and where, instead, high power amplifiers are readily available.

At high frequencies the output power of amplifiers is limited. To reduce the requirement for high feedback injection power we can use pre-matching (see ref. 15) between the fixed coupling section and the adjustable coupling section (indicated "Pre-matching area" in FIGS. 3 and 4). For full description of the setup configuration items 40, 41 and 42 designate digital control of the VNA, the signal source and the electronic tuner (FIG. 4). The pre-matching approach is convenient, because, at high frequencies pre-matching tuners and fixtures are compact, at low frequencies, where such tuners are cumbersome, high power amplifiers are easier to find. In general, though, pre-matching in the return path of the active injection is beneficial. Pre-matching devices can be impedance tuners, pre-matching sections (transformers) on the test fixtures or wire transformers at low frequencies (see ref. 16). Pre-matching devices, as transforming sections on the test fixtures or even pre-matching tuners can also be inserted between the DUT output port and the input port of the first coupling section.

In an alternative embodiment the operation frequency can be lower than the local oscillator frequency whilst the heterodyne concept remains still valid. In this case the frequency Fo, at which the DUT operates, becomes the intermediate frequency of the first mixer, which now is an up-converter, instead of down-converter as it is in the first embodiment. The output frequency of the first mixer is now a high frequency, the sum of Fo and F1 and fits into the operation bandwidth of the electronic tuner section, which remains the same as in the first embodiment. At the output of the circulator (port 3, FIG. 6) the signal is now down-converted back to Fo; that is, the second mixer is now a down-converter. The low and high pass filters are also swapped. The low frequency signal (Fo=$F_{IF}$) is then processed the same as the high frequency $F_{RF}$ in the first embodiment, amplified and injected back into the DUT. The concept is the same as in FIG. 6, using only different terminology as follows: Fo=$F_{IF}$, LPF and HPF are swapped, and $F_{IF}$ becomes $F_{RF}$. In this embodiment the relation between frequencies uses the opposite sign: $F_{IF}=F_{LO}-F_{RF}$. Or in both embodiments $F_{IF}=|F_{RF}-F_{LO}|$. This last embodiment offers, hitherto unexplored, methods for making high speed, broadband active low frequency (low MHz range) load pull tuners.

In one more embodiment (FIG. 15) either of the coupling sections can be replaced by power dividers (see ref. 17). A power divider is, by its nature, wideband (over two octaves), thus overcoming the octave bandwidth limitation of circulators. A power divider in place of the first coupling section is inserted with its common port attached to the DUT, one of the secondary ports connected with the up-converter (mixer 1) and the second port connected with the output port of the amplifier via the second coupling section. A power divider in place of the second coupling section is inserted with its common port attached to the output of the power amplifier, one of the secondary ports connected with the output port of the first coupling section and the second port terminated with characteristic impedance (Zo).

This application discloses the concept of a heterodyne, broadband high-speed active load pull tuner. Obvious alternatives shall not impede on the originality of the concept.

What I claim as my invention is:

1. A heterodyne active load pull tuner comprising:
 a) a first coupling section having input, output and coupled port,
 b) an up- and a down-conversion section,
 c) a digital electronic tuning section,
 d) an amplifier having input port and output port and
 e) a second coupling section having input, output and coupled port,
wherein
 signal extracted from a device under test (DUT) is sampled by the first coupling section and injected into (i) the up- or (ii) the down-conversion section;
 the signal extracted from the conversion section is injected into the digital tuning section, the signal extracted from the tuning section is injected into (ii) the down- or (i) the up-conversion section correspondingly, the signal extracted from the conversion section is injected into the amplifier and the signal extracted from the amplifier is injected back into the DUT via the second coupling section.

2. The tuner of claim 1, wherein
the first coupling section is adjustable and comprises:
 a low loss transmission line (slabline) having a test port and an idle port,
 wherein the idle port is the output port of the first coupling section, and
 a mobile carriage travelling along the slabline and having a mobile vertical axis,
 and a wave-probe attached to the vertical axis and insertable into the slabline.

3. The tuner of claim 1,
wherein
 the conversion section comprises:
 a down-converter and an up-converter, a
 low pass filter (LPF) and
 a high pass filter (HPF);
 each converter being a mixer having RF port, LO port and IF port
 and each filter having input port and output port.

4. The tuner of claim 1,
wherein
 the digital tuning section comprises:
 a remotely controlled digital electronic tuner having a test port and an idle port,
 a circulator having ports 1, 2 and 3,
 wherein port 1 is the input port, port 2 is connected to the test port of the electronic tuner and port 3 is the output port,
and wherein
 the idle port of the electronic tuner is terminated with characteristic impedance.

5. The tuner of claim 2 or claim 3 or claim 4,
wherein
 the LO ports of mixer 1 and mixer 2 are connected to an external local oscillator, the RF port of mixer 1 is connected to the coupled port of the first coupling section, the IF port of mixer 1 is connected to the input port of the low pass filter,
 the output port of the low pass filter is connected to port 1 of the circulator, port 2 of the circulator is connected to the test port of the electronic tuner, port 3 of the circulator is connected to the IF port of mixer 2,
 the RF port of mixer 2 is connected to the input port of the high pass filter,
 the output port of the high pass filter is connected to the input port of the amplifier,
 the output port of the amplifier is connected to the coupled port of the second coupling section,
 the input port of the second coupling section is connected to the output port of the first coupling section,
 the output port of the second coupling section is terminated with characteristic impedance.

6. The tuner of claim 2 or claim 3 or claim 4, wherein
the LO ports of mixers 1 and 2 are connected to an external local oscillator,
the IF port of mixer 1 is connected to the coupled port of the first coupling section, the RF port of mixer 1 is connected to the input port of the high pass filter,
the output port of the high pass filter is connected to port 1 of the circulator, port 2 of the circulator is connected to the test port of the electronic tuner, port 3 of the circulator is connected to the RF port of mixer 2, the IF port of mixer 2 is connected to the input port of the low pass filter, the output port of the low pass filter is connected to the input port of the amplifier, the output port of the amplifier is connected to the coupled port of the second coupling section, the input port of the second coupling section is connected to the output port of the first coupling section, the output port of the second coupling section is terminated with characteristic impedance.

7. The tuner of claim 1, wherein
the second coupling section has coupling factor between approximately 3 and 6 dB.

8. The tuner of claim 1,
wherein
the frequency of an external local oscillator $F_{LO}$ tracks the frequency $F_{RF}$ of the signal extracted from the DUT by an intermediate frequency $F_{IF}=|F_{RF}-F_{LO}|$.

9. The first coupling section as in claim 2,
wherein the horizontal movement of the carriage and the vertical movement of the axis are remotely controlled.

10. The tuner of claim 1, wherein
the second coupling section is eliminated, and the output port of the amplifier is connected directly to the output port of the first coupling section.

11. The tuner of claim 1, wherein
a pre-matching device is inserted between the output port of the first coupling section and the input port of the second coupling section.

12. The tuner of claim 1,
wherein
a pre-matching device is inserted between the output port of the DUT and the input port of the first coupling section.

13. The tuner of claim 1, wherein
the second coupling section is a circulator,
and wherein
port 1 of the circulator is connected to the output port of the amplifier,
port 2 of the circulator is connected to the output port of the first coupling section,
and port 3 of the circulator is terminated with characteristic impedance.

14. The tuner of claim 1, wherein
the first coupling section is a power divider having an input and two output ports, a first output port and a second output port,
and wherein
the input port is connected to the DUT output port,
the first output port is connected to mixer 1, and
the second output port is connected to the input port of the second coupling section.

15. The tuner of claim 1, wherein
the second coupling section is a power divider having an input and two output ports, a first output port and a second output port,
and wherein
the input port is connected to the output port of the power amplifier,
the first output port is connected to the output port of the first coupling section, and
the second output port is terminated with characteristic impedance.

16. The tuner of claim 1,
wherein
the first coupling section is a first power divider and the second coupling section is
a second power divider, each power divider having an input and two output ports,
a first output port and a second output port,
and wherein
the output port of the DUT is connected to the input port of the first power divider,
the first output port of the first power divider is connected to mixer 1,
the second output port of the first power divider is connected to the first output port of the second power divider,
the input port of the second power divider is connected to the output port of the amplifier, and
the second output port of the second power divider is terminated with characteristic impedance.

* * * * *